US010985087B2

(12) United States Patent
Imoto et al.

(10) Patent No.: US 10,985,087 B2
(45) Date of Patent: Apr. 20, 2021

(54) WIRING BOARD

(71) Applicant: NGK SPARK PLUG CO., LTD., Nagoya (JP)

(72) Inventors: Yosuke Imoto, Nagoya (JP); Shinichiro Haneishi, Nagoya (JP); Kenji Suzuki, Nagoya (JP); Norihiko Kawai, Nagoya (JP); Naoki Kito, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 16/583,959

(22) Filed: Sep. 26, 2019

(65) Prior Publication Data

US 2020/0111724 A1    Apr. 9, 2020

(30) Foreign Application Priority Data

Oct. 5, 2018 (JP) .............................. JP2018-190121
Aug. 23, 2019 (JP) .............................. JP2019-152451

(51) Int. Cl.
*H01L 23/433* (2006.01)
*H01L 23/043* (2006.01)
(Continued)

(52) U.S. Cl.
CPC .......... *H01L 23/433* (2013.01); *H01L 23/043* (2013.01); *H01L 23/367* (2013.01);
(Continued)

(58) Field of Classification Search
CPC ... H01L 23/433; H01L 23/043; H01L 23/367; H01L 23/492; H01L 24/48; H01L 24/32;
(Continued)

(56) References Cited

U.S. PATENT DOCUMENTS 6,058,023 A    5/2000   Ahn et al.
6,900,986 B2 *  5/2005   Kimoto ................. H02M 7/003
                                                           257/678
2019/0214784 A1  7/2019   Yamamoto et al.

FOREIGN PATENT DOCUMENTS

JP           5452345 B2      3/2014
JP         2015-185622 A    10/2015
(Continued)

OTHER PUBLICATIONS

Yosuke Imoto, et al., U.S. Appl. No. 16/584,074 for Wiring Board, filed Sep. 26, 2019.
(Continued)

*Primary Examiner* — Jasmine J Clark
(74) *Attorney, Agent, or Firm* — Stites & Harbison, PLLC; Jeffrey A. Haeberlin; James R. Hayne

(57) ABSTRACT

A wiring board has a metal-made base having a front surface and a back surface, an insulating frame body bonded to the front surface of the base through a bonding layer made of bonding material, a mounting area where a component is supposed to be mounted on the front surface of the base, and a restriction portion formed by a groove or a protrusion that is provided on the front surface of the base or by a combination of the groove and the protrusion. The restriction portion is arranged in at least a part of an area between the mounting area and the frame body on the front surface in plan view.

12 Claims, 3 Drawing Sheets

(51) Int. Cl.
  *H01L 23/367*  (2006.01)
  *H01L 23/00*  (2006.01)
  *H01L 33/50*  (2010.01)
  *H01L 33/62*  (2010.01)
  *H01L 33/64*  (2010.01)
  *H01L 33/48*  (2010.01)

(52) U.S. Cl.
  CPC ............ *H01L 24/48* (2013.01); *H01L 33/486* (2013.01); *H01L 33/507* (2013.01); *H01L 33/62* (2013.01); *H01L 33/642* (2013.01); *H01L 2224/48247* (2013.01)

(58) Field of Classification Search
  CPC ............... H01L 24/29; H01L 24/73; H01L 2924/15159; H01L 2224/32245; H01L 33/507; H01L 33/62; H01L 33/642; H01L 33/486; H01L 2224/48247
  See application file for complete search history.

(56) References Cited

FOREIGN PATENT DOCUMENTS

| | | |
|---|---|---|
| JP | 2015-204426 A | 11/2015 |
| JP | 2018-110263 A | 7/2018 |

OTHER PUBLICATIONS

Japan Patent Office, Office Action (Notice of Reasons for Refusal) issued in corresponding Application No. JP 2019-152451 dated Sep. 4, 2020.

Japan Patent Office, Office Action (Notice of Reasons for Refusal) issued in corresponding Application No. JP 2019-152451, dated Feb. 18, 2021.

* cited by examiner

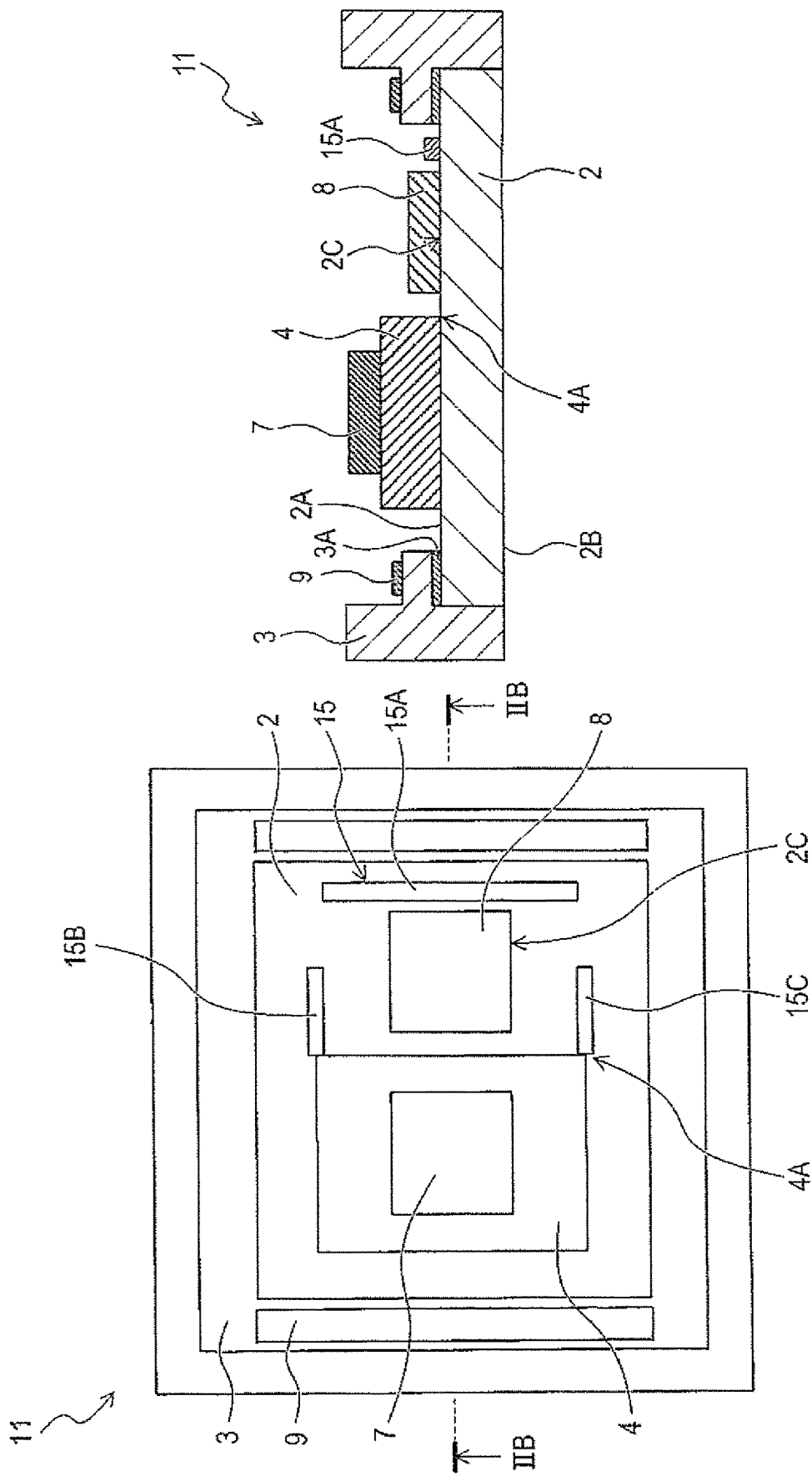

WIRING BOARD

BACKGROUND OF THE INVENTION

The present disclosure relates to a wiring board.

Japanese Unexamined Patent Application Publication No. 2015-204426 (hereinafter is referred to as "JP2015-204426") discloses a wiring board. In JP2015-204426, in order to enhance a heat radiation performance of a component, such as a semiconductor device, mounted on the board, a metal-made base is fixed to a frame body. More specifically, the base is bonded to the frame body through a bonding material such as a brazing material.

Here, when the base is bonded to the frame body, if the molten bonding material flows to a mounting area where the component such as an electronic component is supposed to be mounted, the bonding material hardens in the mounting area and bumps are formed. These bumps cause inadequate bonding of the component to the base, and also result in the component slanting which causes poor mount of the component. The poor mount of the component consequently leads to decrease in bonding strength of the component, in the heat radiation performance of the component and in accuracy of a mounting position of the component.

Therefore, in JP2015-204426, by providing a stepped portion at the frame body, the flow of the bonding material to the mounting area is suppressed.

SUMMARY OF THE INVENTION

In a configuration that suppresses the flow of the bonding material by the stepped portion provided at the frame body in JP2015-204426, however, a bonding area between the base and the frame body becomes small due to the stepped portion. As a result, there is a possibility that airtightness of a bonding portion will be deteriorated.

An object of the present disclosure is therefore to provide a wiring board that is capable of suppressing the flow of the bonding material to the mounting area while maintaining or securing the bonding area between the base and the frame body.

According to one aspect of the present disclosure, a wiring board comprises: a metal-made base having a front surface and a back surface; an insulating frame body bonded to the front surface of the base through a bonding layer made of bonding material; a mounting area provided on the front surface of the base, a component being supposed to be mounted on the mounting area; and a restriction portion formed by a groove or a protrusion that is provided on the front surface of the base or by a combination of the groove and the protrusion, the restriction portion arranged in at least a part of an area between the mounting area and the frame body on the front surface in plan view.

According to the above configuration of the wiring board, when bonding the frame body to the base, flow of the bonding material forming the bonding layer is restricted or limited by the restriction portion. It is therefore possible to suppress the flow of the bonding material to the mounting area without decreasing a bonding area between the base and the frame body.

The above wiring board could further comprise a seating provided in an area that is located at an inner side with respect to the frame body on the front surface of the base and that is different from the mounting area.

According to the above configuration of the wiring board, it is possible to place a plurality of components at different height positions in three dimensions. Further, in the case where the seating is provided on the front surface of the base, the seating forms a protuberance on the front surface of the base. In the case where the protuberance is formed on the front surface of the base, there is a tendency for the molten bonding material to flow to the mounting area along an outer edge of the protuberance. Therefore, the restriction portion functions more effectively.

In the above wiring board, the seating and the restriction portion could be each formed integrally with the base.

According to the above configuration of the wiring board, it is possible to easily form the seating and the restriction portion. Further, since heat can flow from the seating to the base without being interfered, it is possible to enhance the heat radiation performance of the component mounted on the seating.

In the above wiring board, the restriction portion could be arranged in an area where the seating is not provided between the mounting area and the frame body.

According to the above configuration of the wiring board, the flow of the bonding material to the mounting area can be suppressed. This configuration can also reduce a forming position and a forming area of the restriction portion, which suppresses an unintentional increase in size of the wiring board. In addition, it is possible to reduce machine-hour for machining the front surface of the base.

In the above wiring board, the restriction portion could contact a root portion, which connects to the base, of the seating.

According to the above configuration of the wiring board, flow of the bonding material to the root portion of the seating, which is the outer edge, where the molten bonding material tends to flow, of the protuberance of the seating, can be suppressed. It is therefore possible to avoid a fillet being formed at the root portion of the seating, thereby surely suppressing poor mount of the component on the base.

In the above wiring board, the mounting area could be seamlessly enclosed with the seating and the restriction portion.

According to the above configuration of the wiring board, it is possible to surely suppress flow of the bonding material to the mounting area. And also, it is possible to avoid a fillet being formed at the root portion of the seating.

In the above wiring board, the restriction portion is formed by at least the groove, and a depth of the groove is half of a thickness of the base or less.

According to the above configuration of the wiring board, it is possible to suppress decrease in heat radiation performance and strength of the base.

In the above wiring board, the restriction portion could be formed by at least the protrusion.

According to the above configuration of the wiring board, even when a flow amount of the bonding material is large, it is possible to guide the bonding material outside the mounting area.

The above wiring board could further comprise a connecting pad provided at the frame body and configured to be electrically connected to the component. In the above wiring board, a height of the protrusion could be a height of the connecting pad from the front surface of the base or lower.

According to the above configuration of the wiring board, when electrically connecting the connecting pad provided at the frame body and the component through a connecting member (such as wire bonding), it is possible to suppress a short circuit due to contact of the connecting member to the base and also suppress lowering of workability of a connecting process.

In the above wiring board, the frame body could be principally made of ceramic. This can obtain a semiconductor package having high heat resistance.

In the above wiring board, the base could be made of at least one of copper, copper alloy and copper complex. This can increase a heat transfer performance of the base.

The above wiring board could further comprise the component mounted on the mounting area. This can obtain a semiconductor package having high reliability.

The other objects and features of this invention will become understood from the following description with reference to the accompanying drawings.

BRIEF DESCRIPTION OF THE DRAWINGS

FIG. 2A is a schematic plan view of the wiring board according to a second embodiment of the present invention.
FIG. 2B is a schematic sectional view taken along a line IIB-IIB of FIG. 2A.

DETAILED DESCRIPTION OF THE INVENTION

Embodiments of the present invention will be explained below with reference to the drawings.

1. First Embodiment

[1-1. Configuration]

Figure 1A:
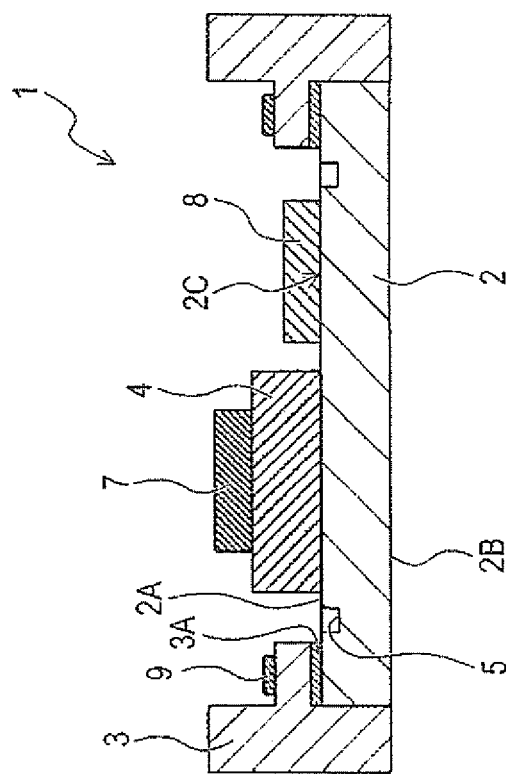
FIG. 1A is a schematic plan view of a wiring board according to a first embodiment of the present invention.
Figure 1B:
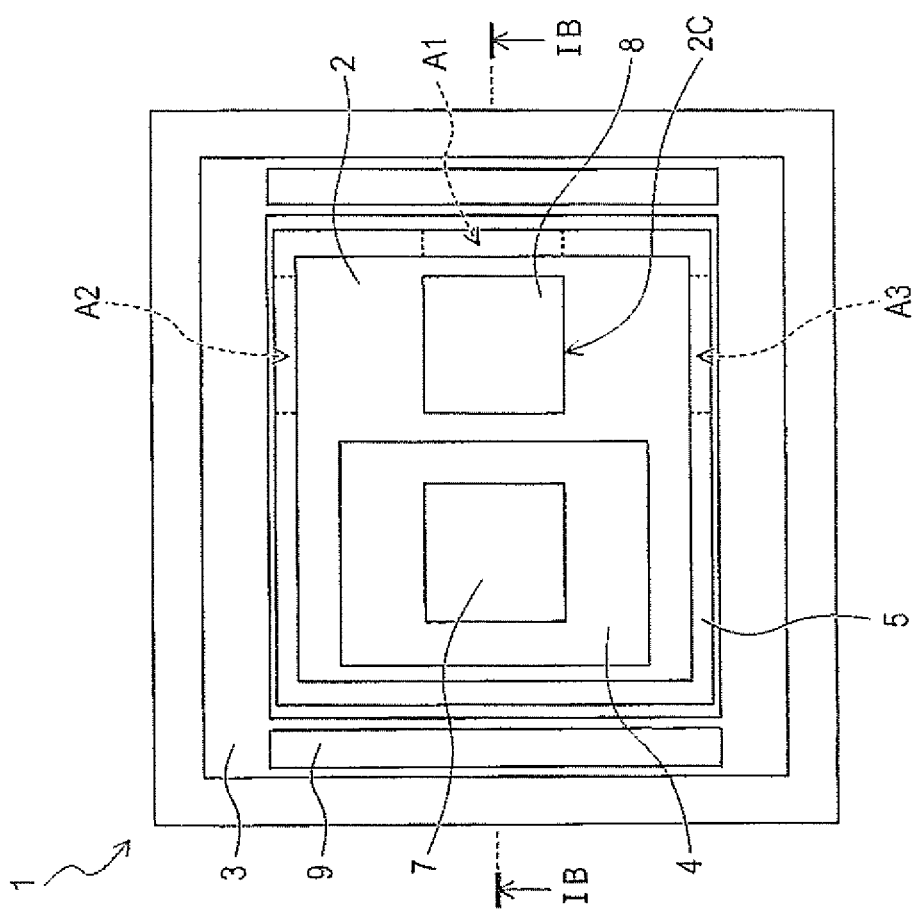
FIG. 1B is a schematic sectional view taken along a line IB-IB of FIG. 1A.

A wiring board 1 shown in FIGS. 1A and 1B has a base 2, a frame body 3, a pedestal (or a seating) 4, a restriction portion (or a limiting portion) 5, a first component 7 mounted on the wiring board 1 and a second component 8 mounted on the wiring board 1.

<Base>

The base 2 is a metal-made plate member having a front surface 2A and a back surface 2B. The base 2 functions as a heat radiation member for the first component 7 and the second component 8. The base 2 could be made of at least one of copper, copper alloy and copper complex in terms of heat transfer performance. As the copper alloy, it could be an alloy having copper as a main component and containing nickel, phosphorus, zinc, tin, aluminium etc. Here, the "main component" means a component whose rate is 90 mass % or more. As the copper complex, for instance, it is a complex formed by impregnating copper in porous material whose skeletal structure is formed by tungsten, or a complex having a multilayer structure formed by alternately stacking copper and molybdenum. Here, a heat sink having a heat radiation fin etc. could be joined to the back surface 2B of the base 2.

The base 2 has, on the front surface 2A thereof, a mounting area 2C where the second component 8 is supposed to be mounted. The mounting area 2C is an area that is identical with or corresponds to an outer edge of the second component 8 in plan view (i.e. when viewed from a direction perpendicular to a surface direction in which the front surface 2A expands).

In the present embodiment, since the second component 8 is actually mounted on the mounting area 2C, the mounting area 2C completely overlaps the second component 8. The second component 8 is bonded to the mounting area 2C with, for instance, a brazing material, a solder or a resin adhesive.

Further, the mounting area 2C is provided at a position between the after-mentioned frame body 3 and the seating 4 in plan view. Furthermore, the mounting area 2C is located so as to be separate from the frame body 3 and also from the seating 4.

<Frame Body>

The frame body 3 is an insulating member that is bonded to a periphery of the front surface 2A of the base 2 through a bonding layer 3A. The frame body 3 is bonded to the base 2 so as to enclose the mounting area 2C and the seating 4 in plan view.

In the present embodiment, the frame body 3 is a layered body formed by stacking a plurality of insulating layers. The frame body 3 is provided with a wiring (not shown). This wiring includes wiring patterns arranged on a surface of the insulating layer, conductors penetrating the insulating layers, connecting pads 9 configured to be electrically connected to the first and second components 7 and 8 when energization of the first and second components 7 and 8 is needed, and so on.

Material of the insulating layer of the frame body 3 is not especially limited, but it is preferable for the frame body 3 to be principally made of ceramic in terms of heat resistance. As the ceramic, it could be alumina, beryllia, aluminium nitride, boron nitride, silicon nitride and glass. These ceramics can be used solely or used in combination with two or more ceramics combined together.

The bonding layer 3A is formed by solidification of a bonding material having fluidity. As a melting point of the bonding layer 3A, 300° C. or higher is preferable. As the bonding material forming the bonding layer 3A, it could be a brazing material, a solder and a resin adhesive. In terms of heat resistance, the brazing material or the solder is preferable. As the brazing material, for instance, it is a silver-based brazing material. As the solder, for instance, it is a gold tin solder.

<Seating>

The seating 4 is a metal-made portion provided in an area located inside the frame body 3 (or located at an inner side with respect to the frame body 3) on the front surface 2A of the base 2.

In the present embodiment, the seating 4 is formed integrally with the base 2. More specifically, the seating 4 is formed by protuberance of a part of the front surface 2A of the base 2. In other words, the seating 4 is a section where a thickness of the base 2 is thicker than other sections of the base 2.

The first component 7 is placed on the seating 4. The first component 7 is bonded to a surface of the seating 4 with, for instance, a brazing material, a solder or a resin adhesive. The seating 4 is located so as to be separate from the frame body 3.

<Restriction Portion>

The restriction portion 5 is formed by a groove arranged on the front surface 2A of the base 2. This groove is a section where the thickness of the base 2 is thinner than other sections of the base 2.

The restriction portion 5 is provided in at least a part of an area between the mounting area 2C and the frame body 3 on the front surface 2A in plan view. More specifically, the restriction portion 5 is formed into an annular shape so as to seamlessly enclose the seating 4 and the mounting area 2C in plan view. Further, the restriction portion 5 extends parallel to an inner edge of the frame body 3 in plan view. That is, the restriction portion 5 is arranged at a position that is offset inward from the inner edge of the frame body 3 by a predetermined distance.

The restriction portion 5 is disposed so as to spread to a first area A1 located at an opposite side to the seating 4 with respect to the mounting area 2C and spread to second and third areas A2 and A3 located at opposite sides of the mounting area 2C in a direction (in an up-and-down direction in FIG. 1A) perpendicular to an opposing direction (in a right-and-left direction in FIG. 1A) of the mounting area 2C and the seating 4. That is, the restriction portion 5 is disposed in an area where the seating 4 is not present (or is not provided) between the mounting area 2C and the frame body 3.

As a depth of the groove forming the restriction portion 5, half of a thickness of the base 2 or less is preferable. If the depth of the groove is too great, volume of the base 2 is decreased, then there is a risk of decreasing a heat radiation performance of the base 2 and decreasing a strength of the base 2. Here, the groove forming the restriction portion 5 could partly overlap the seating 4 or the mounting area 2C (i.e. the second component 8) in plan view.

Further, the restriction portion 5 could be formed by a protrusion that protrudes from the front surface 2A of the base 2. By forming the restriction portion 5 by the protrusion, even when a flow amount of the bonding material is large, it is possible to guide the bonding material outside the mounting area 2C. Moreover, the restriction portion 5 may be formed by the groove and the protrusion in combination.

As a height of the protrusion forming the restriction portion 5, a height of the connecting pad 9 provided at the frame body 3 from the front surface 2A of the base 2 or lower is preferable. If the height of the protrusion is too high, when electrically connecting the connecting pads 9 provided at the frame body 3 and the first and second components 7 and 8 through a connecting member (such as wire bonding (not shown)), there are risks that not only the wire of the connecting member will contact the base 2 then a short circuit will occur, but also workability of a connecting process will be lowered.

<Component>

The first component 7 and the second component 8 are each a component that generates heat by its operation.

As the first component 7, it could be an LED (Light Emitting Diode) or an LD (Laser Diode). As the second component 8, it could be a light wavelength convertor having phosphor. With this combination, a wiring board for a light source such as a head lamp, a variety of lightings and a laser projector can be obtained.

The first component 7 and the second component 8 are directly bonded to the seating 4 and the base 2 respectively after the frame body 3 is bonded to the base 2 with the bonding layer 3A. As mentioned above, for energization of the first and second components 7 and 8, the first and second components 7 and 8 are each electrically connected to the connecting pad 9 through the wire bonding.

[1-2. Effect]

According to the embodiment described above, the following effects can be obtained.

(1a) When bonding the frame body 3 to the base 2, flow of the bonding material forming the bonding layer 3A is restricted or limited by the restriction portion 5. It is therefore possible to suppress the flow of the bonding material to the mounting area 2C without decreasing a bonding area between the base 2 and the frame body 3.

(1b) The restriction portion 5 is formed into the annular shape so as to seamlessly enclose the seating 4 and the mounting area 2C in plan view. Therefore, the flow of the bonding material to the mounting area 2C can surely be suppressed. Further, it is possible to avoid a fillet being formed at a root portion of the seating 4, thereby surely suppressing poor mount of the second component 8 on the base 2.

(1c) Since the seating 4 itself forms the protuberance on the front surface of the base 2 and there is a tendency for the molten bonding material to flow to the mounting area along an outer edge of the protuberance, the restriction portion 5 functions more effectively.

(1d) The seating 4 and the restriction portion 5 are each formed integrally with the base 2. It is therefore possible to easily form the seating 4 and the restriction portion 5. Further, since heat can flow from the seating 4 to the base 2 without being interfered, it is possible to enhance the heat radiation performance of the first component 7 mounted on the seating 4.

2. Second Embodiment

[2-1. Configuration]

A wiring board 11 shown in FIGS. 2A and 2B has the base 2, the frame body 3, the pedestal (or the seating) 4, a restriction portion (or a limiting portion) 15, the first component 7 mounted on the wiring board 1 and the second component 8 mounted on the wiring board 1. Since the base 2, the frame body 3, the seating 4, the first component 7 and the second component 8 of the present embodiment are the same as those of the wiring board 1 of the first embodiment (FIG. 1A), these are denoted by the same reference signs, and their explanation will be omitted.

<Restriction Portion>

The restriction portion 15 has a band-shaped first portion 15A located at an opposite side to the seating 4 with respect to the mounting area 2C and band-shaped second and third portions 15B and 15C located at opposite sides of the mounting area 2C in a direction perpendicular to an opposing direction of the mounting area 2C and the seating 4.

The first portion 15A is arranged so as to be separate from the frame body 3 and also from the mounting area 2C. The first portion 15A extends in the direction perpendicular to the opposing direction of the mounting area 2C and the seating 4. In FIG. 2B, the first portion 15A is formed by the protrusion. However, the first portion 15A could be formed by the groove.

With respect to the second portion 15B and the third portion 15C, their one end portions contact a root portion 4A, which connects to the base 2, of the seating 4. That is, each of the second portion 15B and the third portion 15C extends from the root portion 4A of the seating 4 in a direction moving away from the seating 4 (i.e. in a direction parallel to the opposing direction of the mounting area 2C and the seating 4 in FIG. 2A). Each of the second portion 15B and the third portion 15C could be formed by the groove or could be formed by the protrusion.

The second portion 15B and the third portion 15C are not connected to the first portion 15A. Therefore, in the present embodiment, areas where the restriction portion 15 is not provided between the mounting area 2C and the frame body 3 exist. That is, the mounting area 2C is non-seamlessly enclosed with the seating 4 and the restriction portion 15.

[2-2. Effect]

According to the embodiment described above, the following effects can be obtained.

(2a) Flow of the bonding material to the root portion 4A of the seating 4, which is the outer edge, where the molten bonding material tends to flow, of the protuberance of the seating 4, can be suppressed by the second portion 15B and the third portion 15C each contacting the root portion 4A of the seating 4. It is therefore possible to avoid a fillet being formed at the root portion 4A of the seating 4.

(2b) Flow of the bonding material for bonding the frame body 3 and the base 2 together from the opposite side to the seating 4 with respect to the mounting area 2C toward the mounting area 2C can be suppressed by the first portion 15A located at the opposite side to the seating 4 with respect to the mounting area 2C. Here, in the present embodiment, flow of the bonding material from the seating 4 side toward the mounting area 2C is suppressed by the seating 4.

(2c) In the present embodiment, the flow of the bonding material to the mounting area 2C can be suppressed by the configuration in which the restriction portion 15 is disposed in an area where the seating 4 is not present (or is not provided) between the mounting area 2C and the frame body 3. This configuration can reduce a forming position and a forming area of the restriction portion 15, which suppresses an unintentional increase in size of the wiring board 11. In addition, it is possible to reduce machine-hour for machining the front surface 2A of the base 2.

3. Third Embodiment

[3-1. Configuration]

Figure 3A:
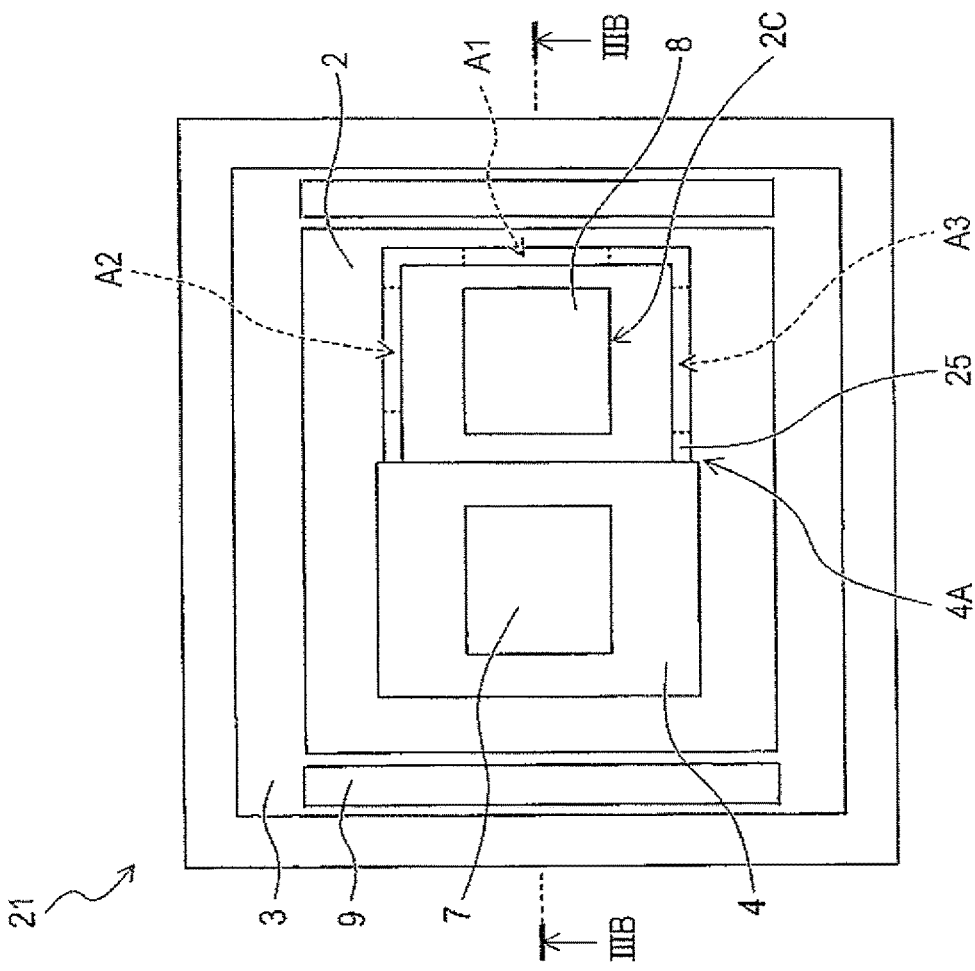
FIG. 3A is a schematic plan view of the wiring board according to a third embodiment of the present invention.
Figure 3B:
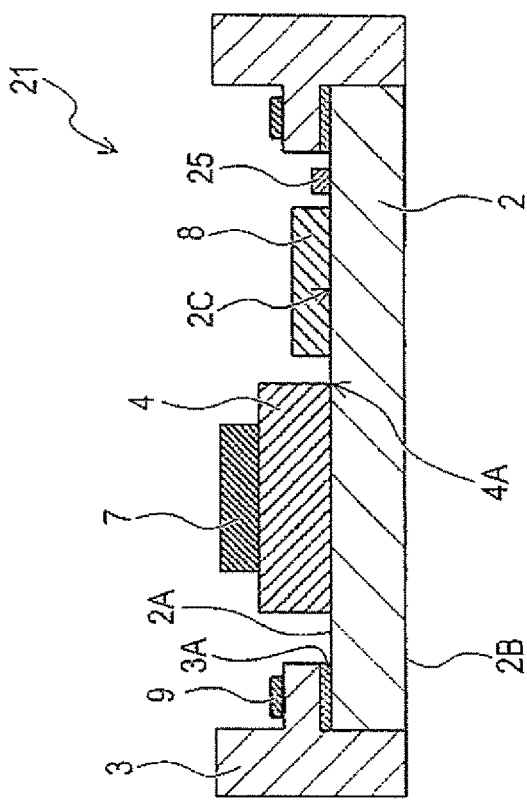
FIG. 3B is a schematic sectional view taken along a line IIIB-IIIB of FIG. 3A.

A wiring board 21 shown in FIGS. 3A and 3B has the base 2, the frame body 3, the pedestal (or the seating) 4, a restriction portion (or a limiting portion) 25, the first component 7 mounted on the wiring board 1 and the second component 8 mounted on the wiring board 1. Since the base 2, the frame body 3, the seating 4, the first component 7 and the second component 8 of the present embodiment are the same as those of the wiring board 1 of the first embodiment (FIG. 1A), these are denoted by the same reference signs, and their explanation will be omitted.

<Restriction Portion>

The restriction portion 25 is disposed so as to spread to a first area A1 located at an opposite side to the seating 4 with respect to the mounting area 2C and spread to second and third areas A2 and A3 located at opposite sides of the mounting area 2C in a direction perpendicular to an opposing direction of the mounting area 2C and the seating 4.

More specifically, the restriction portion 25 is formed into a U-shape or a square-bracket shape whose both ends contact the root portion 4A, which connects to the base 2, of the seating 4. Therefore, the mounting area 2C is seamlessly enclosed with the seating 4 and the restriction portion 25. The restriction portion 25 is arranged so as to be separate from the frame body 3. The restriction portion 25 could be formed by the groove or could be formed by the protrusion.

[3-2. Effect]

According to the embodiment described above, the following effects can be obtained.

(3a) Since the mounting area 2C is enclosed by combination of the seating 4 and the restriction portion 25, it is possible to suppress flow of the bonding material to the mounting area 2C. Further, since the both ends of the restriction portion 25 contact the root portion 4A, which connects to the base 2, of the seating 4, it is possible to avoid a fillet being formed at the root portion 4A of the seating 4.

4. Other Embodiments

Although the disclosure has been explained above by reference to certain embodiments, the disclosure is not limited to the embodiments described above, but includes a various modifications.

(4a) Each of the wiring boards 1, 11 and 21 could have a plurality of seatings 4. Conversely, each of the wiring boards 1, 11 and 21 is not necessarily provided with the seating 4. Further, the base 2 could have a plurality of mounting areas 2C.

(4b) The seating 4 of each of the wiring boards 1, 11 and 21 is not necessarily formed integrally with the base 2. The seating 4 could be bonded to the base 2 with a bonding material. Likewise, the protrusion forming the restriction portions 5, 15 and 25 is not necessarily formed integrally with the base 2. In a case where the seating 4 and the base 2 are prepared as different members then the seating 4 is bonded to the base 2, material of the seating 4 could be the same as that of the base 2 or might be different from that of the base 2. In a case where the material of the seating 4 is different from that of the base 2, it is preferable that the seating 4 be made of material that is superior in heat radiation performance, such as aluminium nitride, alumina, copper, copper alloy, copper complex, aluminum and iron-nickel alloy.

(4c) In the wiring boards 1, 11 and 21 of the above embodiments, the mounting area 2C is not necessarily enclosed with the restriction portion 5 or with the combination of the seating 4 and the restriction portion 15 or 25. For instance, in the wiring board 11 shown in FIG. 2A, the restriction portion 15 could have any one of the first portion 15A, the second portion 15B and the third portion 15C.

(4d) The wiring boards 1, 11 and 21 of the above embodiments could not have at least one of the first component 7 and the second component 8. That is, an idea of the present disclosure includes a wiring board before a part or all of the components that is supposed to be mounted is mounted.

(4e) Functions performed by one element or one component of the above embodiments could be performed by a plurality of elements or a plurality of components, and functions performed by a plurality of elements or a plurality of components could be performed by one element or one component. Further, a part of the configuration of the above embodiments could be omitted. Moreover, at least a part of the configuration of the above embodiment could be added to the configuration of the other embodiments, or might be replaced in the configuration of the other embodiments. All embodiments included in technical ideas that can be understood from contents recited in scope of claim are the embodiments of the present disclosure.

EMBODIMENT

Test carried out to confirm the effect of the present disclosure and its evaluation will be explained below.

Embodiment 1

The frame body 3 was brazed to the base 2 (its average thickness except the protrusion is 500 μm) that is provided, as the protrusion, with the restriction portion 25 shown in FIG. 3A. A measured thickness of the fillet formed at the root portion of the seating 4 due to the bonding material was 20 μm. Further, the test confirmed that flow of the brazing material (i.e. the bonding material) to the mounting area 2C did not occur.

Comparative Example 1

The frame body 3 was brazed to the base 2 (its average thickness is the same as the above embodiment 1) that is not provided with the restriction portion 25 shown in FIG. 3A. A measured thickness of the fillet formed at the root portion of the seating 4 due to the bonding material was 51 μm. Further, the test confirmed that the brazing material (i.e. the bonding material) flowed to the mounting area 2C from an opposite side to the seating 4 with respect to the mounting area 2C, and 10 μm bumps were formed in the mounting area 2C.

<Consideration>

The results of the embodiment 1 and the comparative example 1 confirmed that the forming of the fillet at the root portion of the seating 4 was able to be suppressed by the restriction portion 25. Further, the results confirmed that the flow of the bonding material to the mounting area 2C was able to be suppressed.

The entire contents of Japanese Patent Applications No. 2018-190121 filed on Oct. 5, 2018 and No. 2019-152451 filed on Aug. 23, 2019 are incorporated herein by reference.

Although the invention has been described above by reference to certain embodiments of the invention, the invention is not limited to the embodiments described above. Modifications and variations of the embodiment described above will occur to those skilled in the art in light of the above teachings. The scope of the invention is defined with reference to the following claims.

What is claimed is:

1. A wiring board comprising:
   a base having a front surface and a back surface, the base comprising metal;
   an insulating frame body bonded to the front surface of the base through a bonding layer made of bonding material;
   a mounting area provided on the front surface of the base, the mounting area configured for a component to be mounted on the mounting area; and
   a restriction portion provided on the front surface of the base, the restriction portion arranged in at least a part of an area between the mounting area and the frame body on the front surface in plan view;
   wherein the restriction portion includes a groove defined in the front surface of the base, a protrusion protruding from the front surface of the base, or both a groove defined in the front surface of the base and a protrusion protruding from the front surface of the base.

2. The wiring board as claimed in claim 1, further comprising:
   a seating provided on the front surface of the base in an area that is different from the mounting area;
   wherein, the frame body encloses the seating.

3. The wiring board as claimed in claim 2, wherein:
   the seating and the restriction portion are each formed integrally with the base.

4. The wiring board as claimed in claim 2, wherein:
   the restriction portion is arranged between the mounting area and the frame body and in an area where the seating is not provided.

5. The wiring board as claimed in claim 2, wherein:
   the restriction portion contacts a root portion, which connects to the base, of the seating.

6. The wiring board as claimed in claim 5, wherein:
   the mounting area is seamlessly enclosed with the seating and the restriction portion.

7. The wiring board as claimed in claim 1, wherein:
   the restriction portion includes at least the groove defined in the front surface of the base, and
   a depth of the groove is half of a thickness of the base or less.

8. The wiring board as claimed in claim 1, wherein:
   the restriction portion includes at least the protrusion protruding from the front surface of the base.

9. The wiring board as claimed in claim 8, further comprising:
   a connecting pad provided at the frame body and configured to be electrically connected to the component, and wherein
   a height of the protrusion is less than or equal to a height of the connecting pad from the front surface of the base.

10. The wiring board as claimed in claim 1, wherein:
    the frame body is principally made of ceramic.

11. The wiring board as claimed in claim 1, wherein:
    the base is made of at least one of copper, copper alloy and copper complex.

12. The wiring board as claimed in claim 1, further comprising:
    the component mounted on the mounting area.

* * * * *

UNITED STATES PATENT AND TRADEMARK OFFICE
CERTIFICATE OF CORRECTION

PATENT NO. : 10,985,087 B2
APPLICATION NO. : 16/583959
DATED : April 20, 2021
INVENTOR(S) : Yosuke Imoto et al.

Page 1 of 1

It is certified that error appears in the above-identified patent and that said Letters Patent is hereby corrected as shown below:

In the Claims

Claim 1, Column 9, Line 42, replace "fora" with "for a"

Signed and Sealed this
Eighteenth Day of May, 2021

Drew Hirshfeld
*Performing the Functions and Duties of the*
*Under Secretary of Commerce for Intellectual Property and*
*Director of the United States Patent and Trademark Office*